US009042176B2

(12) United States Patent
Shim (10) Patent No.: US 9,042,176 B2
(45) Date of Patent: May 26, 2015

(54) SEMICONDUCTOR MEMORY DEVICE, SYSTEM HAVING THE SAME AND PROGRAM METHOD THEREOF

(71) Applicant: SK hynix Inc., Incheon-si Gyeonggi-do (KR)

(72) Inventor: Jung Woon Shim, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 73 days.

(21) Appl. No.: 13/948,366

(22) Filed: Jul. 23, 2013

(65) Prior Publication Data

US 2014/0169097 A1    Jun. 19, 2014

(30) Foreign Application Priority Data

Dec. 18, 2012    (KR) .......................... 10-2012-0148380

(51) Int. Cl.
  *G11C 16/04*    (2006.01)
  *G11C 16/24*    (2006.01)
  *G11C 16/34*    (2006.01)

(52) U.S. Cl.
  CPC ............ *G11C 16/24* (2013.01); *G11C 16/0483* (2013.01); *G11C 16/3418* (2013.01); *G11C 16/3454* (2013.01)

(58) Field of Classification Search
  CPC .............. G11C 16/0483; G11C 16/10; G11C 16/3404; G11C 16/3418; G11C 16/3413; G11C 8/08; G11C 7/22; G11C 7/12; G11C 11/4091; G11C 11/406
  USPC ............. 365/185.17, 185.24, 185.25, 185.18, 365/189.09, 189.16, 189.11, 203
  See application file for complete search history.

(56) References Cited

U.S. PATENT DOCUMENTS

| 6,212,109 | B1 * | 4/2001 | Proebsting ............... 365/189.16 |
| 6,282,135 | B1 * | 8/2001 | Proebsting .................... 365/203 |
| 2009/0086542 | A1 * | 4/2009 | Lee et al. ................. 365/185.17 |
| 2010/0002515 | A1 * | 1/2010 | Lutze et al. ............. 365/185.17 |

FOREIGN PATENT DOCUMENTS

| KR | 1020110078731 A | 7/2011 |
| KR | 1020120020388 A | 3/2012 |

* cited by examiner

*Primary Examiner* — Gene Auduong
(74) *Attorney, Agent, or Firm* — William Park & Associates Ltd.

(57) ABSTRACT

The present invention relates to a semiconductor memory device and a program method thereof. The program method according to an embodiment of the present invention includes: precharging a plurality of cell strings by providing a positive voltage to the plurality of cell strings through a common source line; and performing a program operation on selected memory cells by applying a program pulse to the selected memory cells.

18 Claims, 5 Drawing Sheets

SEMICONDUCTOR MEMORY DEVICE, SYSTEM HAVING THE SAME AND PROGRAM METHOD THEREOF

CROSS-REFERENCE TO RELATED APPLICATION

The present application claims priority under 35 U.S.C. §119(a) to Korean Patent Application No. 10-2012-0148380, filed on Dec. 18, 2012, in the Korean Intellectual Property Office, which is incorporated herein by reference in its entirety.

BACKGROUND

1. Field

The present invention relates generally to an electronic device, and more particularly to a semiconductor memory device and a program method thereof.

2. Discussion of Related Art

A semiconductor memory device is an electronic data storage device that exploits the electronic properties of semiconductor materials such as silicon (Si), germanium (Ge), and a gallium arsenide (GaAs), indium phosphide (InP). A semiconductor memory device is divided into a volatile memory device and a nonvolatile memory device.

The volatile memory device requires power supply to maintain the stored data. The volatile memory device includes a static RAM (SRAM), a Dynamic RAM (DRAM), a Synchronous DRAM (SDRAM), and the like. By contrast, the nonvolatile memory device maintains data stored in the device even in absence of power supply. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

The semiconductor memory device stores information in a memory cell array which includes a plurality of memory cells. For example, the memory cell array includes a plurality of cell strings. An interval between each of the plurality of memory cells and an interval between each of the plurality of cell strings continue to decrease to highly integrate the semiconductor memory device, thereby increasing disturbance between the plurality of memory cells and between the plurality of cell strings. Because the disturbance may deteriorate the reliability of the semiconductor memory device, various methods to reduce the disturbance are being developed.

SUMMARY

The present invention has been made in an effort to provide a semiconductor memory device having improved reliability, and a program method thereof.

An embodiment of the present invention provides a program method of a semiconductor memory device including: precharging a plurality of cells strings by providing a positive voltage to the plurality of cell strings through a common source line; and performing a program on selected memory cells by applying a program pulse to the selected memory cells.

According to the embodiment, the performing of the program may include electrically connecting the bit lines and the cell strings before the performance of the program on the selected memory cells when a program permission voltage and a program inhibition voltage are applied to the bit lines according to data to be programmed on the selected memory cells. In this case, the electrically connecting of the bit lines and the cell strings is performed after the positive voltage provided to the cell strings through the common source line is blocked.

An embodiment of the present invention provides a semiconductor memory device including: a memory cell array including a plurality of cell strings, bit lines, and a common source line; and a peripheral circuit configured to precharge the plurality of cells strings by providing a positive voltage to the plurality of cell strings and the common source line, and then perform a program on selected memory cells.

An embodiment of the present invention provides a semiconductor memory device including: a memory cell array including a plurality of cell strings connected to bit lines, a common source line, word lines, and a drain selection line; and a peripheral circuit configured to precharge the plurality of cell strings by providing a positive voltage to the plurality of cell strings of a selected memory block through the common source line, and then perform a program operation on selected memory cells.

An embodiment of the present invention provides a memory system including: a memory controller and a semiconductor memory device. The semiconductor memory device includes a memory cell array including a plurality of cell strings, bit lines, and a common source line; and a peripheral circuit configured to precharge the plurality of cell strings by providing a positive voltage to the plurality of cell strings and the common source line, and then performing a program operation on selected memory cells.

An embodiment of the present invention provides an electronic including a memory system communicatively coupled to a central processing unit. The memory system includes a semiconductor memory device. The semiconductor memory device includes a memory cell array including a plurality of cell strings, bit lines, and a common source line; and a peripheral circuit configured to precharge the plurality of cell strings by providing a positive voltage to the plurality of cell strings and the common source line, and then performing a program operation on selected memory cells.

According to various embodiments of the present invention, there is provided the semiconductor memory device having improved reliability, and the program method thereof.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Various embodiments of the present invention will be described with reference to the accompanying drawings in detail. However, the present invention is not limited to an embodiment described herein and may be implemented in other forms. The present invention will be described more fully hereinafter with reference to the accompanying drawings, in which various embodiments of the invention are shown.

Throughout this specification and the claims that follow, when it is described that an element is "connected/coupled" to another element, the element may be "directly connected/coupled" to the other element or "electrically connected/coupled" to the other element through a third element. In addition, unless explicitly described to the contrary, the word "comprise" and variations such as "comprises" or "comprising" will be understood to imply the inclusion of stated elements but not the exclusion of any other elements.

Figure 1:
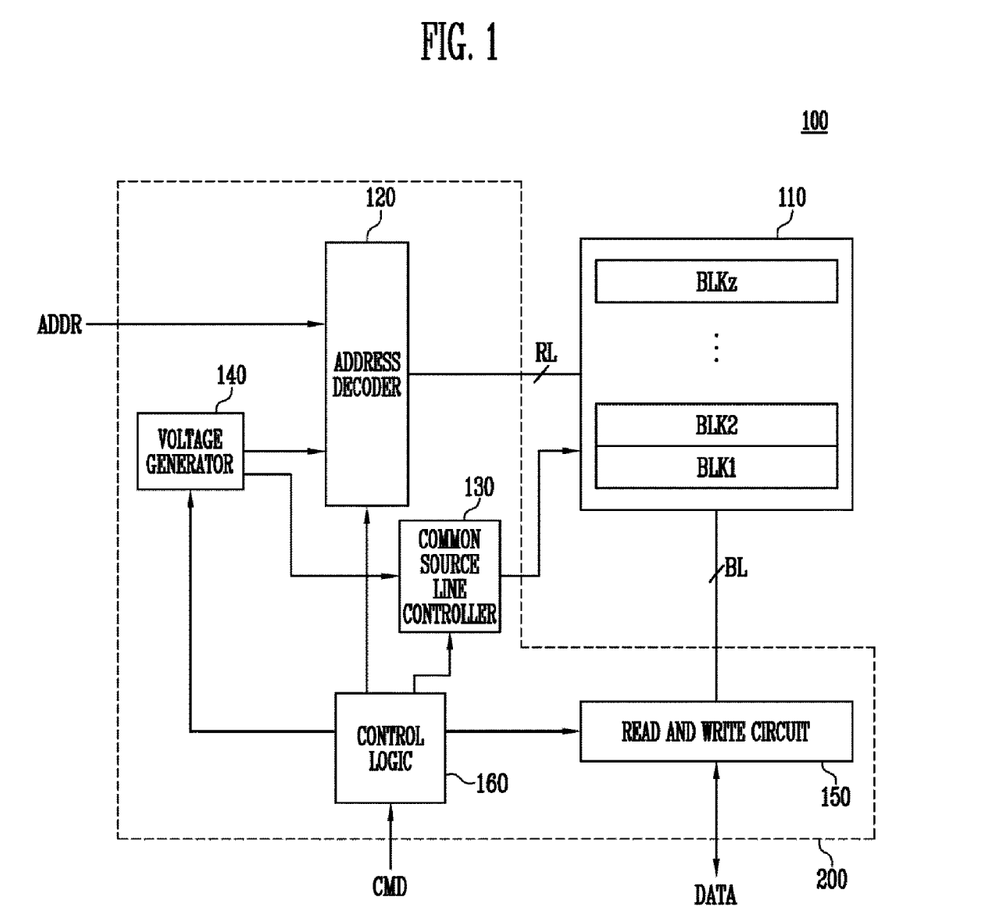
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, a semiconductor memory device 100 may include a memory cell array 110, an address decoder 120, a common source line controller 130, a voltage generator 140, a read and write circuit 150, and a control logic 160.

The memory cell array 100 may include a plurality of memory blocks BLK1 to BLKz. The plurality of memory blocks BLK1 to BLKz may be coupled to the address decoder 120 through row lines, and to the read and write circuit 150 through bit lines BL. Each of the plurality of memory blocks BLK1 to BLKz may include a plurality of memory cells. For example, the plurality of memory cells may be nonvolatile memory cells.

The address decoder 120, the common source line controller 130, the voltage generator 140, the read and write circuit 150, and the control logic 160 may be operated as a peripheral circuit 200 for driving the memory cell array 110.

The address decoder 120 may be coupled to the memory cell array 110 through the row lines RL. The address decoder 120 may configured to be operated in response to a control signal of the control logic 160. The address decoder 120 may receive an address ADDR through a global buffer (not shown) inside the semiconductor memory device 100.

The address decoder 120 may be configured to decode received address ADDR. The received address ADDR may include a block address and a row address. For example, the address decoder 120 may be configured to decode the block address. The address decoder 120 may have one or more selection lines as outputs. For example, the address decoder 120 may select at least one memory block according to the decoded block address.

The address decoder 120 may be configured to decode a row address. The address decoder 120 may apply voltages received from the voltage generator 140 to the row lines RL according to the decoded row address. For example, the address decoder 120 may select one word line of the selected memory block according to the decoded row address.

A program operation of the semiconductor memory device 100 may be performed on a page basis. The address ADDR received when a program operation is requested may include a block address and a row address. In this case, the address decoder 120 may select one memory block and one word line in the memory block according to a block address and a row address.

The address decoder 120 may include an address buffer, a block decoder, a row decoder, and the like.

The common source line controller 130 may drive a common source line (see CSL of FIG. 2) of the memory cell array 110 in response to the control signals of the control logic 160. In an embodiment of the present invention, the common source line controller 130 may apply a positive voltage provided from the voltage generator 140 to the common source line at the time of the program operation.

The voltage generator 140 may be configured to generate a plurality of voltages by using an external power voltage supplied to the semiconductor memory device 100. The voltage generator 140 may be operated in response to the control signals of the control logic 160.

In an embodiment of the present invention, the voltage generator 140 may generate an internal power voltage by regulating the external power voltage. The internal power voltage generated in the voltage generator 140 may be provided to the address decoder 120, the common source line controller 130, the read and write circuit 150, and the control logic 160.

In an embodiment of the present invention, the voltage generator 140 may generate a plurality of voltages having different voltage levels by using the external power voltage or the internal power voltage. For example, the voltage generator 140 may include a plurality of pumping capacitors. For example, the voltage generator 140 may include a plurality of pumping stages, with each pumping stage having a pumping capacitor, and a first pumping stage may receiving the internal power voltage. The voltage generator 140 may generate a plurality of voltages having different voltage levels by selectively activating the plurality of pumping capacitors in response to the control signals of the control logic 160. The generated voltages may be applied to the word lines by the address decoder 120.

The read and write circuit 150 may be coupled to the memory cell array 110 through the bit lines BL. The read and write circuit 150 is operated in response to the control signals of the control logic 160.

The read and write circuit 150 may receive/transmits data DATA from/to the global buffer (not shown) of the semiconductor memory device 100. The read and write circuit 150 may receive and store data DATA to be programmed, and transmit the stored data DATA to the bit lines BL at the time of the program operation. According to the transmitted data, the memory cells coupled to the selected word line (hereinafter, referred to as the "selected memory cells") are programmed.

In an embodiment of the present invention, the read and write circuit 150 may include page buffers (or page registers), a row selection circuit, and the like.

The control logic 160 may be coupled to the address decoder 120, the common source line controller 130, the voltage generator 140, and the read and write circuit 150. The control logic 160 may receive a command CMD, for example, a command CMD indicating the program operation, through the global buffer (not shown) of the semiconductor memory device 100. The control logic 160 may be configured to control a general operation of the semiconductor memory device 100 in response to the command CMD.

Figure 2:
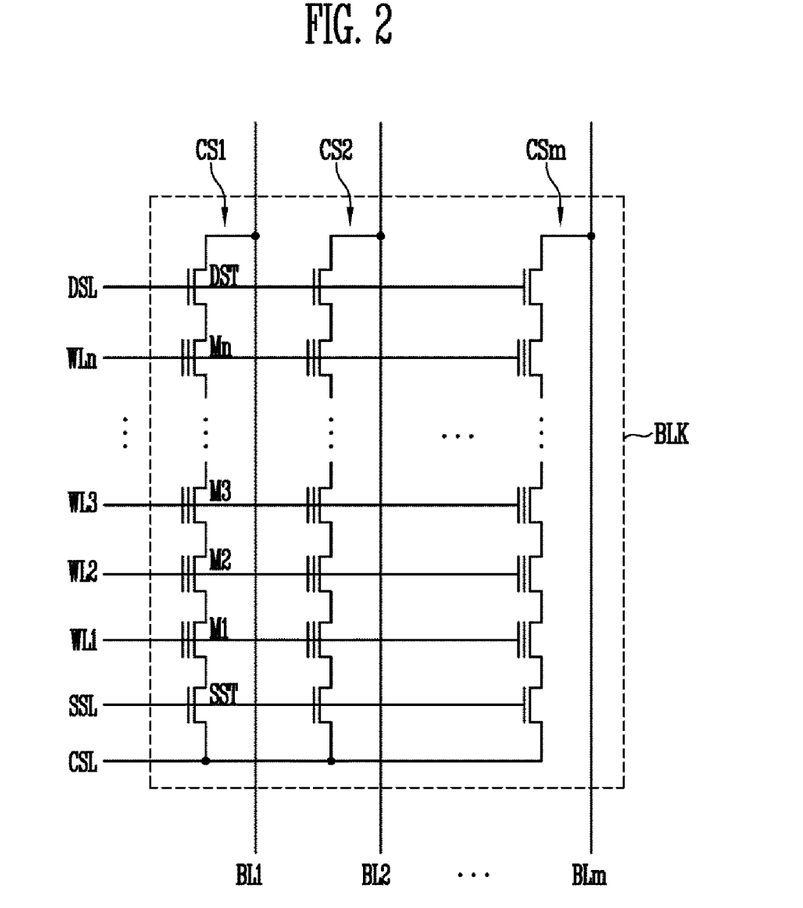
FIG. 2 is a circuit diagram illustrating an example of a plurality of memory blocks of FIG. 1.

FIG. 2 is a circuit diagram illustrating one memory block BLK among the plurality of memory blocks BLK1 to BLKz of FIG. 1, as an example.

Referring to FIGS. 1 and 2, the memory block BLK may include first to $m^{th}$ cell strings CS1 to CSm. The first to $m^{th}$ cell strings CS1 to CSm may be coupled to first to $m^{th}$ bit lines BL1 to BLm, respectively. The first to $m^{th}$ cell strings CS1 to CSm may be coupled to a source selection line SSL, the first to $n^{th}$ word lines WL1 to WLn, and a drain selection line DSL. The source selection line SSL, the first to $n^{th}$ word lines WL1 to WLn, and the drain selection line DSL may be included in the row lines RL described with reference to FIG. 1.

Each of the plurality of cell strings CS1 to CSm may include a source selection transistor SST, a plurality of memory cells M1 to Mn, and a drain selection transistor DST. The source selection transistors SST may be connected to the source selection line SSL. The first to $n^{th}$ memory cells M1 to Mn may be connected to the first to $n^{th}$ word lines WL1 to WLn, respectively. The drain selection transistors DST may be connected to the drain selection line. Source terminals of the source selection transistors SST may be connected to a common source line CSL. Drain terminals of the drain selection transistors DST may be connected to the bit lines BL1 to BLm. The source selection line SSL, the first to $n^{th}$ word lines WL1 to WLn, and the drain selection line DSL may be driven by the address decoder 120. The common source line CSL may be controlled by the common source line controller 130.

In an embodiment of the present invention, although it is not illustrated in FIG. 2, the memory block BLK may be further coupled to at least one dummy word line, and may further include memory cells coupled to at least one dummy word line. In an embodiment of the present invention, the memory block BLK may be coupled to two or more drain selection lines, and may include a plurality of drain selection transistors connected to the drain selection lines. Further, the memory block BLK may be connected to two or more source selection lines, and may include a plurality of source selection transistors connected to the source selection lines.

Figure 3:
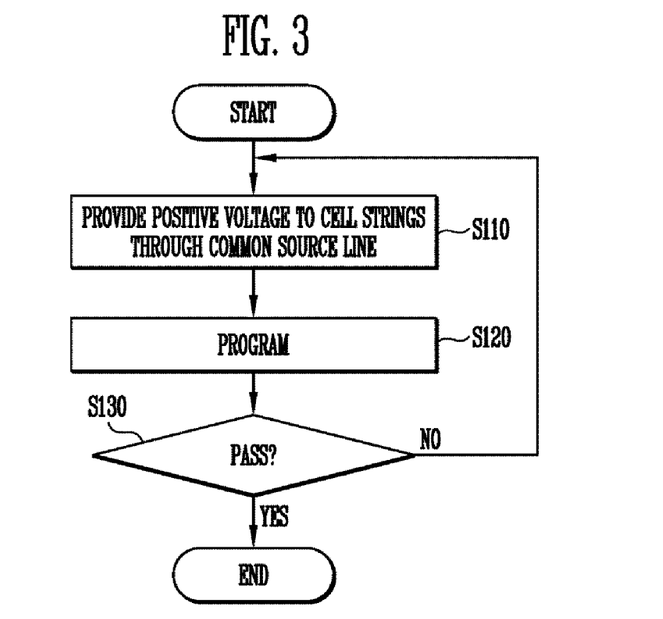
FIG. 3 is a flowchart illustrating a program operation method of the semiconductor memory device according to an embodiment of the present invention.

FIG. 3 is a flowchart illustrating a program operation method of the semiconductor memory device 100 according to an embodiment of the present invention.

Referring to FIGS. 1 to 3, in step S110, a positive voltage may be provided to the cell strings CS1 to CSm of the selected memory block BLK through the common source line CSL. When the positive voltage is applied to the common source line CSL, the address decoder 120 may turn on the source selection transistors SST by applying a predetermined voltage to the source selection line SSL. Further, the address decoder 120 may turn on the memory cells M1 to Mn by applying a setting voltage, which is a high voltage, to the first to $n^{th}$ word lines WL1 to WLn. Accordingly, channels of the cell strings CS1 to CSm may be precharged by the positive voltage applied to the common source line CSL.

If the channels of the cell strings CS1 to CSm are precharged through the bit lines BL1 to BLm, not through the common source line CSL, even when the memory cells near the drain selection transistors DST are normally precharged, the memory cells near the source selection transistors SST may not be charged to a desired voltage. For example, when a plurality of the memory cells, i.e., memory cells connected to the first word line WL1 to memory cells connected to $n^{th}$ word line WLn, are sequentially programmed, if the memory cells between selected memory cells and the source selection transistors SST have stored data, some memory cells near the source selection transistors SST may have high threshold voltages according to data stored therein. In this situation, even if the memory cells near the drain selection transistors DST receive the voltage of the bit lines BL1 to BLm to precharge the channels of the cell strings CS1 to CSm, the memory cells near the source selection transistors SST may not be normally precharged.

In an embodiment of the present invention, the channels of the cell strings CS1 to CSm may be precharged through the common source line CSL. Therefore, the memory cells near the source selection transistors SST may be more effectively precharged. When a high voltage is applied to the first to $n^{th}$ word lines WL1 to WLn so that the memory cells M1 to Mn are turned on, the positive voltage of the common source line CSL may be transferred to channels of the cell strings CS1 to CSm, especially, the memory cells near the drain selection transistors DST.

In step S120, a program operation may be performed on memory cells connected to a selected word line. A program permission voltage, for example, a ground voltage, may be applied to the bit lines coupled to memory cells to be programmed among the memory cells connected to the selected word line. A program inhibition voltage, for example, a power supply voltage, may be applied to the bit lines coupled to memory cells to be program-inhibited among the memory cells connected to the selected word line. For example, a power supply voltage may be applied to the drain selection line DSL. A program pulse of high voltage may be applied to the selected word line, and a pass pulse lower than the program pulse in voltage level may be applied to the non-selected word lines.

The channels of the cell strings coupled to the bit lines to which the program inhibition voltage is applied is boosted. Accordingly, the threshold voltages of program-inhibited memory cells are not increased. By the precharge through the common source line CSL at step S110, the memory cells near the source selection transistors SST may be more effectively precharged, and therefore the boosting of the cell strings may be effectively performed.

The channels of the cell strings coupled to the bit lines to which the program permission voltage is applied have, for example, the ground voltage. The threshold voltages of the memory cells to be programmed are increased, for example, by a difference between the high-voltage program pulse and the ground voltage.

In step S130, it may be determined whether a predetermined number of memory cells have passed a verification. The read and write circuit 150 may read the threshold voltage of the selected memory cells through the bit lines BL, and may determine whether the threshold voltages of the selected memory cells have reached desired levels. In an embodiment of the present invention, if the predetermined number of memory cells have not passed the verification, steps S110 and S120 are performed again. In an embodiment of the present invention, if the number of memory cells that have passed the verification is smaller than the predetermined number, the program operation may be performed from step S120 again (not shown).

According to an embodiment of the present invention, the peripheral circuit 200 may precharge the cell strings CS1 to CSm by supplying the positive voltage to the cell strings CS1 to CSm of the selected memory block BLK through the common source line CSL. Then, the peripheral circuit 200 may perform the program operation on the selected memory cells.

Accordingly, the channels of the cell strings CS1 to CSm near the source selection transistors SST may be effectively precharged, and therefore the boosting of the cell strings may be effectively performed. Accordingly, reliability of the program operation of the semiconductor memory device 100 may be improved.

Figure 4:
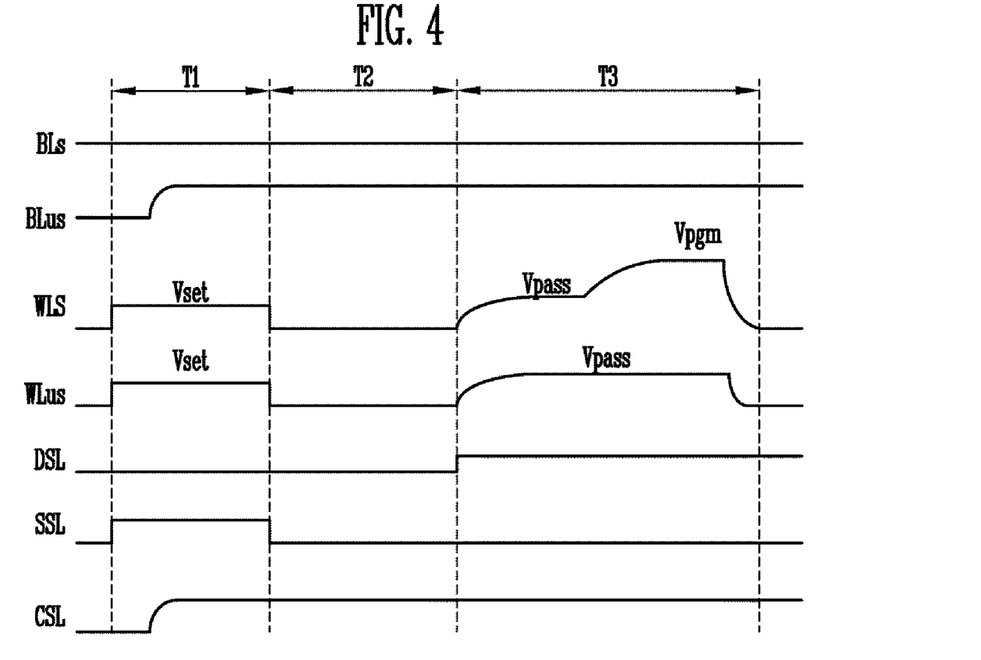
FIG. 4 is a timing diagram illustrating voltages applied to a memory block in steps S110 and S120 of FIG. 3 according to an embodiment of the present invention.

FIG. 4 is a timing diagram illustrating voltages applied to the memory block BLK in steps S110 and S120 of FIG. 3 according to an embodiment of the present invention.

To describe FIG. 4 with reference to FIG. 2, at the first time interval T1, the channels of the cell strings CS1 to CSm may be precharged through the common source line CSL.

The positive voltage may be provided to the common source line CSL from a specific time of the first time interval T1. In this case, a predetermined voltage may be applied to the source selection line SSL, so that the source selection transistors SST are turned on. When the source selection transistors SST are turned on, the common source line CSL and the cell strings CS1 to CSm may be electrically connected.

A setting voltage Vset may be applied to a selected word line WLs among the word lines WL1 to WLn and a non-selected word line WLus among the word lines WL1 to WLn. Accordingly, the memory cells M1 to Mn are turned on. For example, the setting voltage Vset may be higher than the highest threshold voltage among the threshold voltages of the memory cells M1 to Mn, and may be lower than the pass voltage Vpass.

For example, the ground voltage may be applied to the drain selection line DSL, and the drain selection transistors DST may be turned off. As a result, the bit lines BL1 to BLm and the cell strings CS1 to CSm may be electrically isolated.

The bit lines BLs (hereinafter, referred to as "selected bit lines") coupled to the memory cell to be programmed may maintain voltages at the ground voltage level. In an embodiment of the present invention, the voltage of a bit line BLus (hereinafter, referred to as a "non-selected bit line") coupled to the memory cell inhibited from programming may be increased to the power supply voltage during the first time interval T1. In an embodiment of the present invention, the voltage of the non-selected bit line may be increased to the power supply voltage during a second time interval T2, and not during the first time interval T1 (not shown).

At the second time interval T2, the positive voltage provided to the cell strings CS1 to CSm through the common source line CSL may be blocked.

The voltage of the source selection line SSL may be changed to the ground voltage, so that the common source line CSL and the cell strings CS1 to CSm are electrically isolated. Further, the setting voltage Vset may not be applied to the selected word line WLs and the non-selected word line WLus after the first time interval T1 is terminated, and the voltages of the selected word line WLs and the non-selected word line WLus may be changed to the ground voltage. Accordingly, the positive voltage provided to the common source line CSL may not be transferred to the cell strings CS1 to CSm.

In this case, the drain selection line DSL may also maintain voltage at the ground voltage level, so that the drain selection transistor DST is turned off. Accordingly, the cell strings CS1 to CSm may be electrically isolated from the bit lines BL1 to BLm and the common source line CSL. As a result, the cell strings CS1 to CSm are floated.

At a third time interval T3, a program operation may be performed on the selected memory cells.

A predetermined voltage may be applied to the drain selection line DSL, so that the drain selection transistors may be turned on. A program pulse Vpgm may be applied to the selected word line WLs. In an embodiment of the present invention, the increase of the voltage of the selected word line WLs may have two steps. The voltage of the selected word line WLs may be increased to the pass pulse Vpass, after that the voltage of the selected word line WLs reaches the program pulse Vpgm. The pass pulse Vpass may be applied to the non-selected word line WLus. Whether memory cells are programmed or not is determined according to whether the program inhibition voltage is applied or the program permission voltage is applied to the corresponding bit line.

The cell string coupled to the bit line to which the program permission voltage is applied may be stably boosted.

Figure 5:
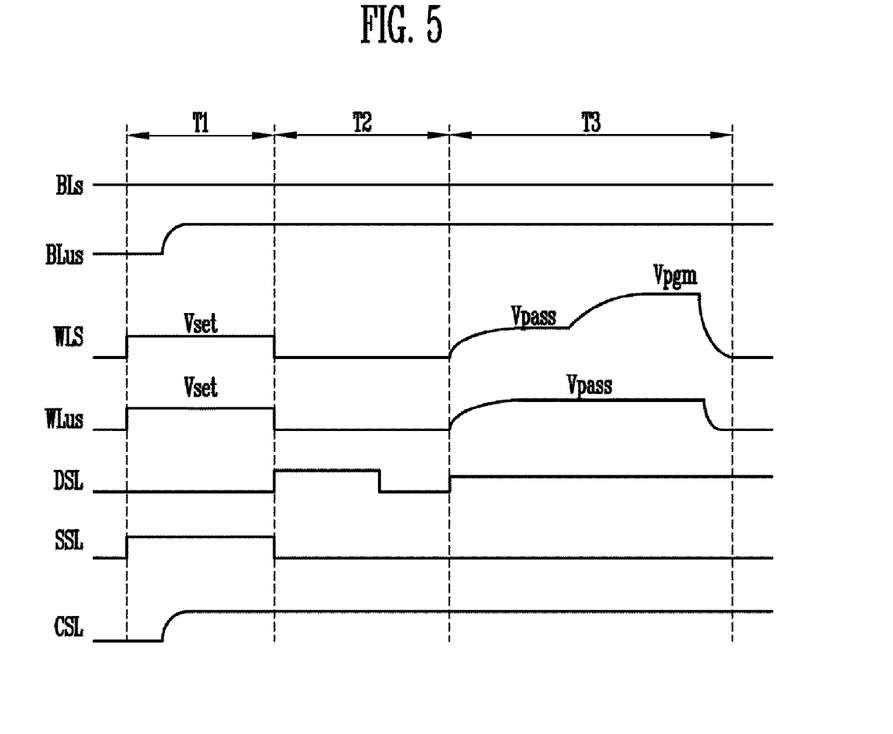
FIG. 5 is a timing diagram illustrating voltages applied to a memory block in steps S110 and S120 of FIG. 3 according to an embodiment of the present invention.

FIG. 5 is a timing diagram illustrating voltages applied to the memory block BLK in steps S110 and S120 of FIG. 3 according to an embodiment of the present invention. In an embodiment of the present invention, the voltages illustrated in FIG. 5 are the same as those of FIG. 4, except for a voltage of the drain selection line DSL at the second time interval T2. Hereinafter, a repeated description will be omitted.

Referring to FIGS. 2 and 5, at the second time interval T2, the voltage of the drain selection line DSL may be increased to a specific voltage so as to turn on the drain selection transistors DST. Accordingly, the bit lines BL1 to BLm and the cell strings CS1 to CSm are electrically connected. In this case, the voltages of the selected word line WLs and the non-selected word line WLus maintain voltages at the ground voltage level.

In an embodiment of the present invention, a plurality of the memory cells, i.e., memory cells connected to the first word line WL1 to memory cells connected to $n^{th}$ word line WLn may be sequentially programmed. If the memory cells between the selected memory cells and the drain selection transistors DST have not stored data, the memory cells may have threshold voltages lower than 0 V. That is, the memory cells between the selected memory cells and the drain selection transistors DST may have an erase state. Accordingly, even if the ground voltage is provided to the selected word line WLs and the non-selected word line WLus, the memory cells between the selected memory cells and the drain selection transistors DST may be turned on. The channels of the memory cells between the selected memory cells and the drain selection transistors DST are precharged by the voltages of the bit lines BL1 to BLm. According to an embodiment of the present invention, the memory cells near the drain selection transistors DST may be further precharged by the voltages of the bit lines BL1 to BLm.

In an embodiment of the present invention, a voltage higher than the ground voltage may be applied to the selected word line WLs and the non-selected word line WLus at the second time interval T2 (not shown). In this case, the memory cells near the drain selection transistors DST may be more effectively precharged by the voltages of the bit lines BL1 to BLm.

According to an embodiment of the present invention, the cell strings CS1 to CSm are precharged through the common source line CSL, and the cell strings CS1 to CSM are further precharged through the bit lines BL1 to BLm, and then the program is performed. Accordingly, the boosting of the cell strings may be effectively performed at the time of the program operation.

Figure 6:
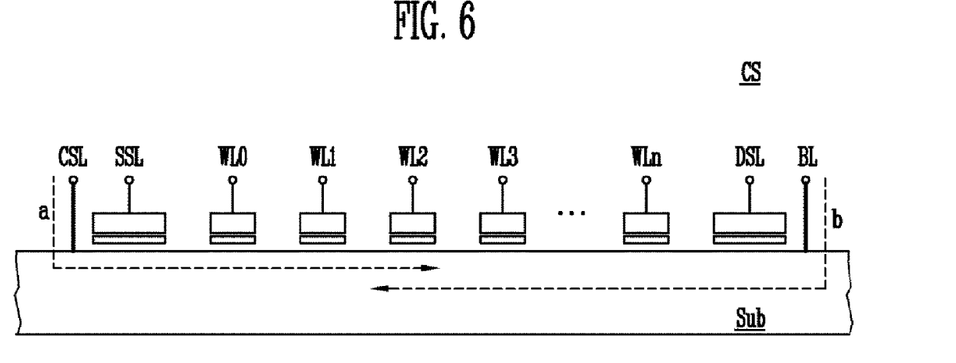
FIG. 6 is a cross-sectional view of one of the cell strings of FIG. 2.

FIG. 6 is a cross-sectional view of any one string CS of the cell strings CS1 to CSm of FIG. 2.

Referring to FIG. 6, the positive voltage may be provided to channel of the cell string CS formed inside the substrate Sub through the common source line CSL (a) & (b). Accordingly, the channel of the cell string CS, especially, channel near the source selection transistor SST, may be effectively precharged. Then, the bit line BL and the cell string CS may be electrically connected. Accordingly, channel near the drain selection transistor DST are effectively precharged. FIG. 6 may also include word lines WL0 to WLn.

According to an embodiment of the present invention, the program operation may be performed after the memory cells near the source selection transistor SST and the memory cells near the drain selection transistor DST are effectively precharged, thereby effectively reducing the disturbance that may occur during the program operation.

Figure 7:
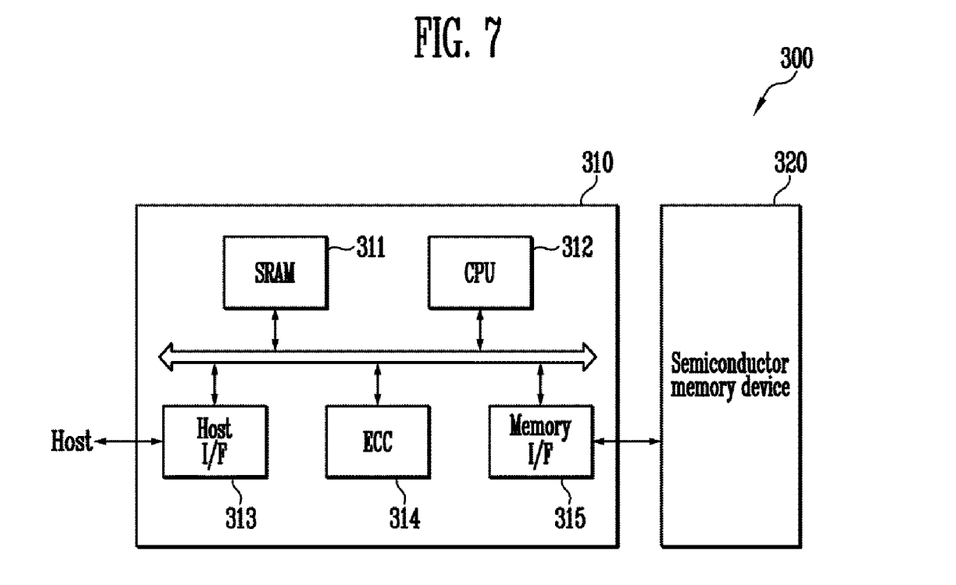
FIG. 7 is a block diagram illustrating a memory system according to an embodiment of the present invention.

FIG. 7 is a block diagram illustrating a memory system according to an embodiment of the present invention.

In FIG. 7, the memory system 300 of the present embodiment may include a semiconductor memory device 320, a memory controller 310, and a CPU 312.

The semiconductor memory device 320 may serve as a volatile memory device such as a DRAM or a nonvolatile memory device such as MRAM, STT-MRAM, PCRAM, ReRAM, or FeRAM. The semiconductor memory device 320 may be a multi-chip package having flash memory chips.

The memory controller 310 may control the semiconductor memory device 320, and may include an SRAM 311, a host interface 313, an Error Correction Code Block (ECC) 314 and a memory interface 315. The SRAM 311 may be used as an operation memory of the CPU 312. The CPU 312 may perform control operation for data exchange of the memory controller 310, and the host interface 313 may have data exchange protocol of a host accessed to the memory system 300. The ECC 314 may detect and correct error of data read from the semiconductor memory device 320, and the memory interface 315 may interface with the semiconductor memory device 320. The memory controller 310 may include further ROM for storing data for interfacing with the host, etc.

The memory system 300 may be used as a memory card or a solid state disk SSD by combination of the semiconductor memory device 320 and the memory controller 310. In the event that the memory system 300 is the SSD, the memory controller 310 may communicate with an external device, e.g. host through one of various interface protocols such as USB, MMC, PCI-E, SATA, PATA, SCSI, ESDI, IDE, etc.

Figure 8:
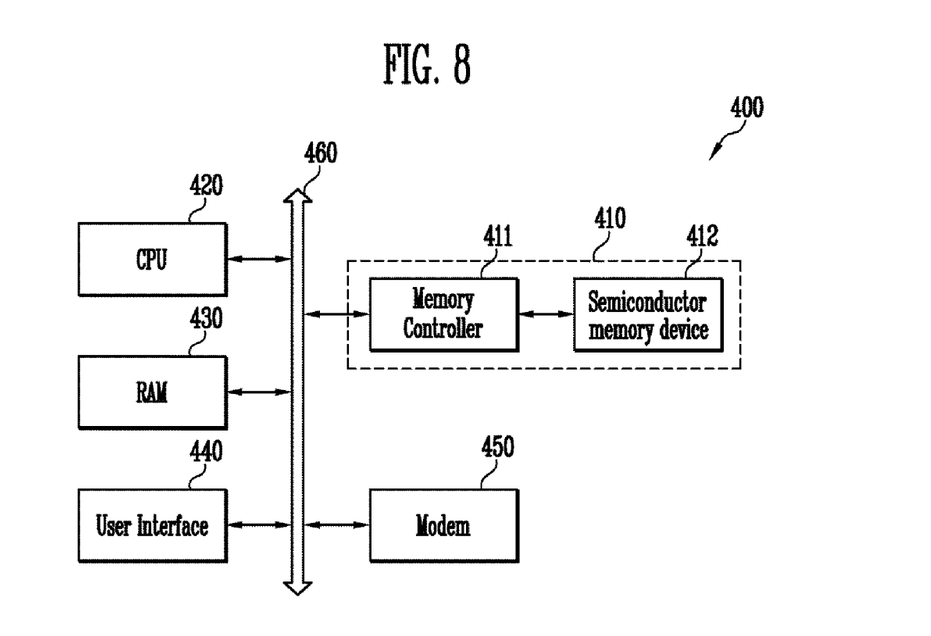
FIG. 8 is a view illustrating an electronic device or a computing system according to an embodiment of the present invention.

FIG. 8 is a view illustrating an electronic device or a computing system according to an embodiment of the present invention.

In FIG. 8, the computing system 400 of the present embodiment may include a CPU 420 connected electrically to a system bus 460, a RAM 430, a user interface or output device 440, a modem or input device 450, and a memory system 410 including a memory controller 411 and a semiconductor memory device 412. In case that the computing system 400 is a mobile device, a battery (not shown) for supplying an operation voltage to the computing system 400 may be further provided. The computing system 400 of the present invention may further include an application chipset, a CMOS image processor CIS, a mobile DRAM, etc.

The output device or user interface 440 may be a self-contained display in the case of a portable electronic device. The input device or modem 450 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 410 may include a semiconductor memory device as described in FIG. 7.

As described above, various embodiments have been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A program method of a semiconductor memory device including a plurality of cell strings coupled between bit lines and a common source line, the program method comprising:
   precharging a plurality of memory cells of the plurality of cell strings by providing a positive voltage to the plurality of cell strings through the common source line before a program operation; and
   performing the program operation on selected memory cells in the precharged cell strings by applying a program pulse to the selected memory cells.

2. The program method of claim 1, before performing the program operation, further comprising:
   applying a program permission voltage and a program inhibition voltage to the bit lines according to data to be programmed on the selected memory cells; and
   electrically connecting the bit lines and the cell strings before performing the program on the selected memory cells.

3. The program method of claim 2, wherein electrically connecting the bit lines and the cell strings is performed after the positive voltage provided to the cell strings through the common source line is blocked.

4. The program method of claim 2, wherein the plurality of cell strings comprises:
   source selection transistors coupled to the common source line;
   drain selection transistors coupled to the bit lines, respectively; and
   the plurality of memory cells coupled between the source selection transistors and the drain selection transistors, and
   wherein electrically connecting the bit lines and the cell strings includes turning on the drain selection transistors.

5. The program method of claim 4, wherein electrically connecting the bit lines and the cell strings includes turning off the source selection transistors.

6. The program method of claim 4, wherein electrically connecting the bit lines and the cell strings further includes applying a ground voltage to word lines coupled to the plurality of memory cells.

7. The program method of claim 1, wherein the plurality of cell strings comprises:
   source selection transistors coupled to the common source line;
   drain selection transistors coupled to the bit lines, respectively; and
   the plurality of memory cells coupled between the source selection transistors and the drain selection transistors.

8. The program method of claim 7, wherein precharging the plurality of cell strings includes electrically connecting the common source line and the plurality of cell strings by turning on the source selection transistors when the positive voltage is applied to the common source line.

9. The program method of claim 8, wherein precharging the plurality of cell strings further includes applying a setting voltage to word lines coupled to the plurality of memory cells so that the plurality of memory cells is turned on.

10. The program method of claim 9, wherein precharging the plurality of cell strings further includes turning off the drain selection transistors.

11. A semiconductor memory device, comprising:
- a memory cell array including a plurality of cell strings coupled between bit lines and a common source line; and
- a peripheral circuit configured to precharge a plurality of memory cells of the plurality of cell strings by providing a positive voltage to the plurality of cell strings through the common source line, and then perform a program operation on selected memory cells in the precharged cell strings.

12. The semiconductor memory device of claim 11, wherein a program permission voltage and a program inhibition voltage are applied to the bit lines according to data to be programmed on the selected memory cells, and
the peripheral circuit electrically connects the bit lines and the plurality of cell strings after providing the positive voltage to the plurality of cell strings through the common source line.

13. The semiconductor memory device of claim 12, wherein when the bit lines and the plurality of cell strings are electrically connected, the peripheral circuit electrically isolates the common source line and the plurality of cell strings.

14. The semiconductor memory device of claim 12, wherein when the bit lines and the plurality of cell strings are electrically connected, the peripheral circuit applies a ground voltage to word lines electrically connected to the selected memory cells.

15. The semiconductor memory device of claim 11, wherein the plurality of cell strings comprises:
- source selection transistors coupled to the common source line;
- drain selection transistors coupled to the bit lines, respectively; and
- the plurality of memory cells coupled between the source selection transistors and the drain selection transistors.

16. The semiconductor memory device of claim 15, wherein when the positive voltage is provided to the common source line, the peripheral circuit turns on the source selection transistors and the plurality of memory cells to precharge the plurality of cell strings.

17. The semiconductor memory device of claim 16, wherein when the source selection transistors and the plurality of memory cells are turned on, the peripheral circuit turns off the drain selection transistors.

18. A semiconductor memory device, comprising:
- a memory cell array including a plurality of cell strings coupled between bit lines and a common source line; and
- a peripheral circuit configured to precharge the plurality of cell strings by providing a positive voltage to the plurality of cell strings through the common source line, and then perform a program operation on selected memory cells in the precharged cell strings,
wherein the plurality of cell strings comprises:
source selection transistors coupled to the common source line;
drain selection transistors coupled to the bit lines, respectively; and
a plurality of memory cells coupled between the source selection transistors and the drain selection transistors,
wherein the peripheral circuit is configured to electrically couple the plurality of cell strings to the common source line by turning on the source selection transistors when the positive voltage is applied to the common source line so as to precharge the plurality of cell strings.

\* \* \* \* \*